(12) United States Patent
Yamazaki

(10) Patent No.: US 7,641,531 B2
(45) Date of Patent: Jan. 5, 2010

(54) ORGANIC LIGHT-EMITTING DEVICE AND MANUFACTURING METHOD THEREFOR

(75) Inventor: Takuro Yamazaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 235 days.

(21) Appl. No.: 11/762,354

(22) Filed: Jun. 13, 2007

(65) Prior Publication Data

US 2008/0042559 A1 Feb. 21, 2008

(30) Foreign Application Priority Data

Jul. 5, 2006 (JP) ............................. 2006-185784
Jun. 1, 2007 (JP) ............................. 2007-146707

(51) Int. Cl.
H01J 9/24 (2006.01)
(52) U.S. Cl. ........................................................ 445/24
(58) Field of Classification Search .................. 445/22, 445/25
See application file for complete search history.

(56) References Cited

U.S. PATENT DOCUMENTS

| | | | |
|---|---|---|---|
| 4,410,580 A | 10/1983 | Okutsu | 428/156 |
| 7,038,836 B2 | 5/2006 | Yamazaki et al. | 359/321 |
| 2002/0180371 A1* | 12/2002 | Yamazaki et al. | 315/169.3 |
| 2007/0222382 A1 | 9/2007 | Yamazaki et al. | 313/512 |

FOREIGN PATENT DOCUMENTS

| | | |
|---|---|---|
| JP | 6-048755 | 2/1994 |
| JP | 2002-352951 | 12/2002 |
| JP | 2003-181825 | 7/2003 |

OTHER PUBLICATIONS

English Translation of JP 2002-352951 A.*

* cited by examiner

Primary Examiner—Toan Ton
Assistant Examiner—Hana A Sanei
(74) Attorney, Agent, or Firm—Fitzpatrick, Cella, Harper & Scinto

(57) ABSTRACT

Provided is an organic light-emitting device capable of cutting an organic light-emitting device panel while suppressing peeling and crack of a sealing layer in a step of cutting the organic light-emitting device panel in which an inorganic sealing layer is formed. The organic light-emitting device includes a substrate having an end portion which includes a divided portion formed by division of the substrate, and an inorganic sealing layer having an end portion including a divided portion formed by division of the inorganic sealing layer, wherein the divided portion of the inorganic sealing layer is positioned on an inner side of a plane of the organic light-emitting device than the divided portion of the substrate.

1 Claim, 4 Drawing Sheets

ORGANIC LIGHT-EMITTING DEVICE AND MANUFACTURING METHOD THEREFOR

BACKGROUND OF THE INVENTION

1. Field of the Invention

The present invention relates to an organic light-emitting device used for a flat device display and the like, and to a manufacturing method therefor.

2. Description of the Related Art

In recent years, as a flat panel display, an organic light-emitting device which is a self-emitting device has been focused. The organic light-emitting device includes at least an organic light-emitting element (organic electroluminescence device (organic EL device)) having a stacked-layer structure in which a first electrode, an organic compound layer, and a second electrode are stacked in mentioned order on a substrate. The organic light-emitting element is liable to be deteriorated in characteristics by water or oxygen. Peeling of the organic compound layer and an electrode layer is caused by a small amount of water, which leads to generation of a dark spot. For this reason, a lifetime of the organic light-emitting element is ensured by covering the organic light-emitting device with an etching glass cover, bonding the periphery thereof with a sealant, inserting a moisture absorbent to an inside thereof, and absorbing water entering from a sealed plane with the moisture absorbent.

In order to achieve an organic light-emitting device reduced in thickness and space by using the organic light-emitting element, it is necessary to reduce a space for the moisture absorbent in the vicinity of a light-emitting region. As a method of sealing the organic light-emitting device without requiring the moisture absorbent, there is a method of stacking a sealing layer on the second electrode of the organic light-emitting element, which requires a sealing layer with high functions for preventing water or oxygen from entering the organic compound layer.

As a specific example of the sealing layer of the organic light-emitting device, there are proposed a silicon nitride oxide layer formed by using a CVD method or a sputtering method, and a sealing layer having ceramics and an organic layer stacked therein. By the use of the sealing layer including those inorganic layers, it is possible to prevent water or oxygen from entering the organic compound layer.

In manufacturing the organic light-emitting device as described above, a plurality of organic light-emitting devices are produced on a large substrate, and then the large substrate is cut into each unit organic light-emitting device, in view of reducing manufacturing costs.

The following is proposed as a method of cutting the large substrate on which the multiple organic light-emitting devices are formed into the each unit organic light-emitting device.

Japanese Patent No. 3042192 discloses an invention which reduces damage to a substrate in a cutting step by subsequently scribing and breaking a liquid crystal display plate from both surfaces thereof in the cutting of the bonded substrate.

Japanese Patent Application Laid-Open No. 2003-181825 discloses an invention which eliminates a cutting failure of an organic EL base substrate by forming a pressure transferring portion for transferring a pressing force obtained in a breaking step from one substrate to the other substrate when many organic EL panels are produced with one organic EL base substrate.

Japanese Patent Application Laid-Open No. 2002-352951 discloses a structure in which a sealing member made of glass and having a plurality of sealing recessed portions formed corresponding to arrangement of an organic EL layer is adhered to a substrate through an adhesive layer. Then, the substrate is cut in the middle of the plurality of sealing recessed portions, and the sealing member is cut at a position closer to the organic EL layer than a cutting position of the substrate.

However, unlike the case of arranging the glass sealing member formed in the manner as in the above-mentioned patent documents on the organic light-emitting element, in a case where the sealing layer is divided after the sealing layer containing an inorganic layer is formed on the organic light-emitting element, peeling and crack of the sealing layer are likely to occur when the sealing layer is divided. In particular, in a case where a member having the organic light-emitting element and the inorganic sealing layer formed on the substrate (organic light-emitting device panel) is divided, by using a general scribing method, at once from the sealing layer side or from the substrate side, peeling or crack of the sealing layer is likely to be generated at the divided position. As a result of the generation of peeling and crack of the sealing layer, water or a gas component enters the organic compound layer, which leads to light emission degradation. Japanese Patent No. 3042192 and Japanese Patent Application Laid-Open No. 2003-181825 do not disclose countermeasures for suppressing the generation of peeling and crack of the inorganic sealing layer at the divided position.

SUMMARY OF THE INVENTION

An object of the present invention is to provide an organic light-emitting device which can be obtained by dividing an organic light-emitting device panel in a step of cutting the organic light-emitting device panel in which the sealing layer containing an inorganic layer is formed while suppressing peeling and crack of a sealing layer; and a manufacturing method therefor.

In order to solve the above-mentioned problems in the related arts, the organic light-emitting device of the present invention obtained by dividing a plurality of organic light-emitting devices integrally formed includes: a substrate having an end portion which includes a divided portion formed by division of the substrate; an organic light-emitting element formed on the substrate and including a first electrode, an organic light-emitting layer, and a second electrode in mentioned order on the substrate; and an inorganic sealing layer including a layer formed on the organic light-emitting element, for covering the organic light-emitting element, and having an end portion including a divided portion formed by division of the inorganic sealing layer, wherein the divided portion of the inorganic sealing layer is positioned on an inner side of a plane of the organic light-emitting device than the divided portion of the substrate.

The method of manufacturing an organic light-emitting device according to the present invention is a method of manufacturing an organic light-emitting device including a substrate; an organic light-emitting element including a first electrode, an organic light-emitting layer, and a second electrode in mentioned order on the substrate; and an inorganic sealing layer covering the organic light-emitting element, including the steps of: forming the organic light-emitting element including the first electrode, the organic light-emitting layer, and the second electrode in mentioned order on the substrate; forming the inorganic sealing layer on the second electrode; dividing the inorganic sealing layer in the vicinity of the organic light-emitting element; and dividing the substrate in the vicinity of the organic light-emitting element, wherein the dividing of the inorganic sealing layer is performed at a position on an inner side of a plane of the organic light-emitting device than a position at which the substrate is divided.

According to the present invention, it is possible to divide an organic light-emitting device panel while preventing a sealing layer from being damaged, for example, being peeled or cracked, in a step of dividing the organic light-emitting device panel in which an inorganic sealing layer is formed. As a result, it is possible to prevent water or a gas component from entering an organic light-emitting layer, thereby obtaining an organic light-emitting device having a longer lifetime while suppressing light emission degradation.

Further features of the present invention will become apparent from the following description of exemplary embodiments with reference to the attached drawings.

DESCRIPTION OF THE EMBODIMENTS

Figure 1:
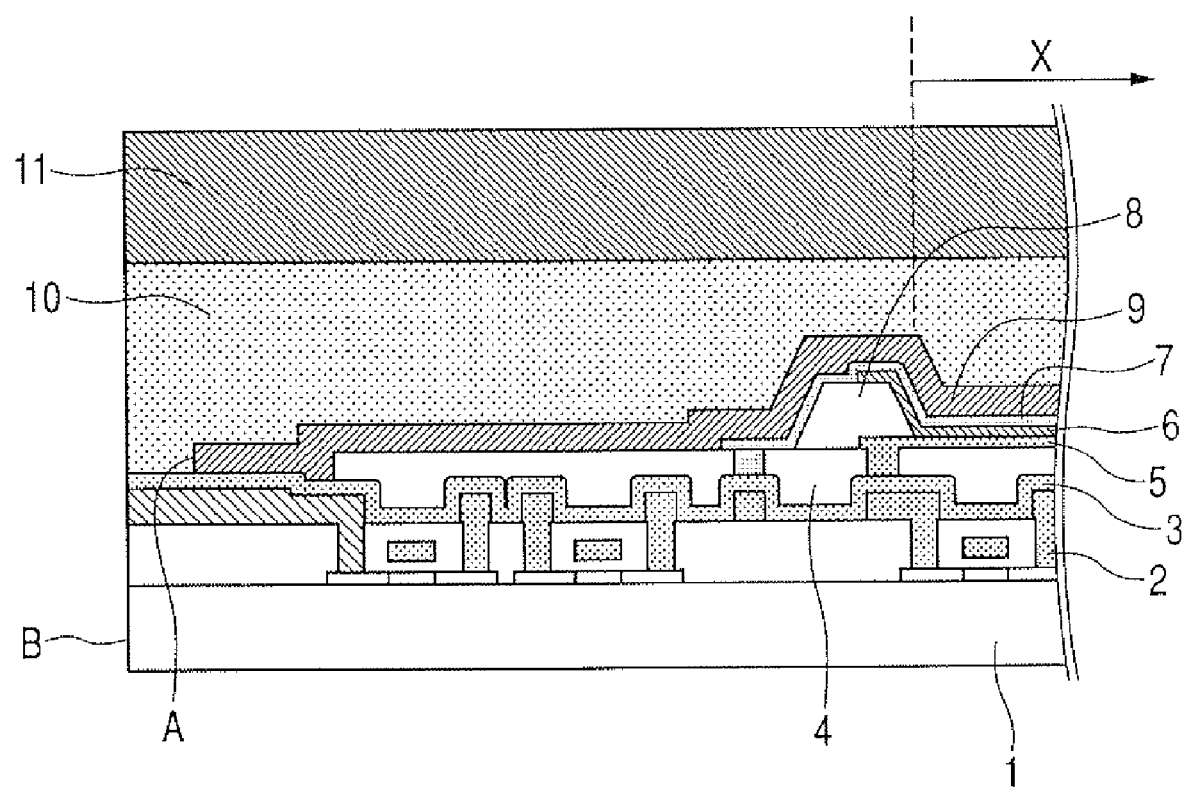
FIG. 1 is a cross-sectional diagram for schematically illustrating an example according to an embodiment of an organic light-emitting device of the present invention.
Figure 2:
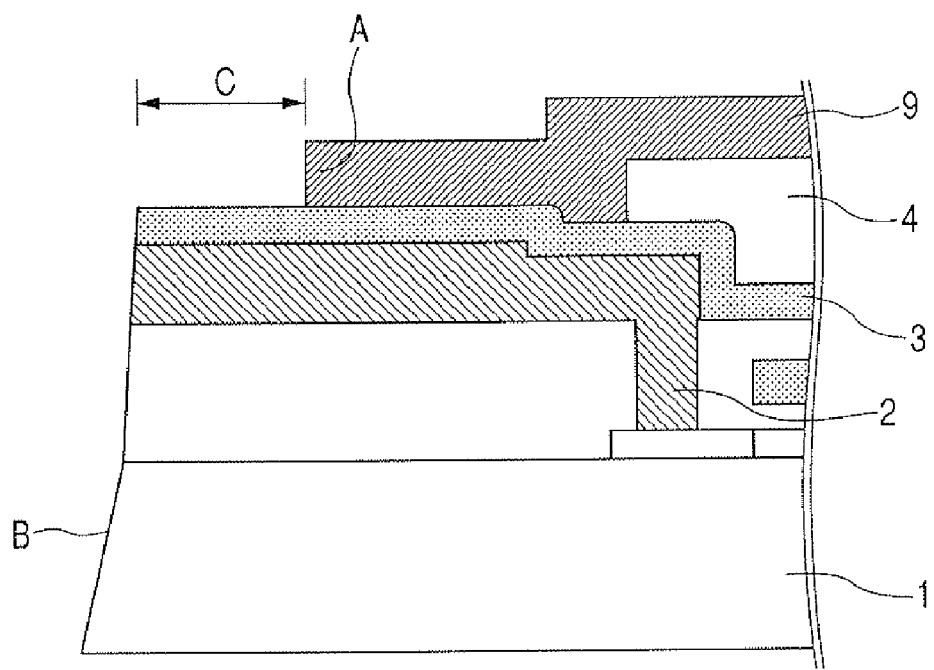
FIG. 2 is a cross-sectional diagram for schematically illustrating an example of a relationship between divided portions in the organic light-emitting device of the present invention.
Figure 3:
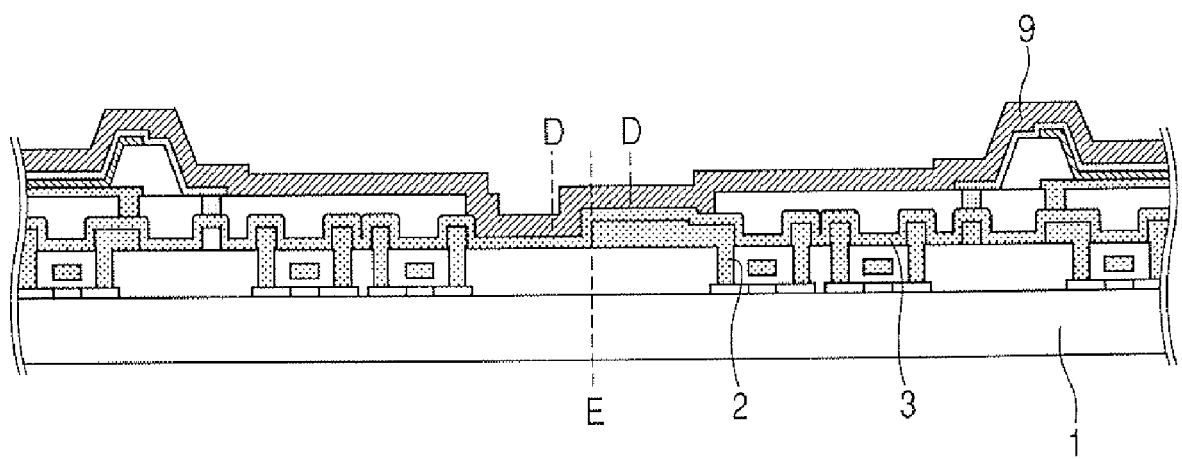
FIG. 3 is a cross-sectional diagram for schematically illustrating an example of a relationship between divided positions in the organic light-emitting device of the present invention.

Hereinafter, an embodiment of the present invention will be described with reference to FIGS. 1 to 3. FIGS. 1 to 3 schematically illustrate an example of a structure of an organic light-emitting device according to the present invention by taking out a part thereof.

FIG. 1 is a cross-sectional diagram for schematically illustrating a part of the organic light-emitting device as an example of the structure thereof, that is, from an end of a light-emitting region to a peripheral region thereof.

On a glass substrate (hereinafter, may simply be abbreviated as "substrate") 1, thin film transistors (TFTs) 2, an insulating layer 3, and an organic planarizing layer 4 are formed in mentioned order. On a top thereof, a first electrode 5 which becomes a unit pixel (element) is formed, and the periphery of each pixel is covered with an element isolation film 8 made of polyimide. On the substrate, an organic compound layer 6 is formed which includes a hole transporting layer, a light-emitting layer, an electron transporting layer, and an electron injection layer subsequently formed. On the top of the organic compound layer, a second electrode 7 is formed, and further an inorganic sealing layer 9 is formed which fully covers the second electrode 7, the organic compound layer 6, the element isolation film 8, and the organic planarizing layer 4 except for an extraction electrode. Then, on the top of the sealing layer 9, a circularly polarizing plate 11 is formed through an adhesive material 10. That is, the organic light-emitting element constituting the organic light-emitting device of the present invention includes at least the first electrode 5, the second electrode 7, and the organic compound layer 6 formed between the first electrode 5 and the second electrode 7. By allowing a current to flow between both the electrodes, a light-emitting material contained in the organic light-emitting layer is excited, thereby causing light emission in transition to a ground state.

In the structure illustrated in FIG. 1, a divided portion A (having a precipitous corner) of the sealing layer 9 is positioned closer to a side of the light-emitting region than a divided portion B of the substrate 1. The light-emitting region indicates a region capable of emitting light by allowing a current to flow therethrough, and corresponds to a region indicated by reference symbol X in FIG. 1.

The first electrode 5 of the organic light-emitting element constituting the organic light-emitting device of the present invention is not particularly limited as long as the first electrode 5 is made of an electrode material having high conductivity. For example, Cr, Al, Ag, or the like which is a high reflective material can be used. A transparent electrode such as an ITO or an IZO may be stacked to be used.

The second electrode 7 is not particularly limited as long as the second electrode 7 is made of an electrode material having high conductivity. For example, an oxide layer containing In, such as ITO or IZO, which is made of a high permeable or semi-permeable material, Ag, and the like can be used.

The sealing layer 9 is not particularly limited as long as the sealing layer 9 has a high ability of blocking water or a gas component. Generally, an inorganic layer which is known as a layer having a high water and gas barrier property, that is, an inorganic sealing layer is used. As the inorganic sealing layer, a layer mainly containing silicon is desirably used. Specifically, silicon nitride, silicon nitride oxide, silicon oxide, or the like is desirably used. A layer made of those materials has high density and a high ability of blocking water and a gas component. Further, depending on characteristics required for the sealing layer, not only an inorganic sealing layer but also an organic sealing layer may be included as the sealing layer. However, the organic sealing layer is desirably not formed in the divided position of the organic light-emitting device because the divided position becomes a propagation path for water or a gas component.

A layer thickness of the sealing layer 9 is not particularly limited as long as an ability of blocking water and a gas component can be ensured. In order to obtain a surface smoothness of the second electrode 7 and a sufficient sealing ability by covering an adhered contaminant or the like, the thickness of the sealing layer 9 is desirably 0.5 µm or more.

The inorganic layer used for the sealing layer 9 of the present invention can be formed by, for example, plasma CVD. By using a VHF band of 30 MHz to 100 MHz as an excitation frequency of the plasma CVD, it is possible to reduce ion impact of plasma and suppress heat damage to the element. In addition, it is possible to achieve an excellent inorganic layer having high density, no defect, high coverage property for an incline or irregularities, high moisture resistance, and low stress.

In a case where the inorganic layer is mainly made of silicon, a hydrogen concentration with respect to the total number of atoms of silicon, nitride, hydrogen, and oxygen is desirably 12 to 32 atomic %. In this case, for example, the inorganic layer has a high adhesive property in a case of using the organic layer as a underlying layer, has an excellent coverage property for irregularities, and is effective in alleviation of a heat stress, resulting in a great effect on temperature rise due to light emission of the organic light-emitting device.

The sealing layer 9 used for the present invention may include stacked layers containing two or more types of layers having different compositions.

Next, the sealing layer divided portion A and the substrate divided portion B will be described in more detail.

FIG. 2 is an enlarged schematic diagram for illustrating a relationship between the sealing layer divided portion A and the substrate divided portion B.

The sealing layer divided portion A and the substrate divided portion B may be formed with inclination with respect to a substrate thickness direction depending on materials and division methods of the substrate and the sealing layer. FIG. 2 illustrates a case where the substrate divided portion B with inclination with respect to the thickness direction of the substrate 1 is formed on each of end portion of the substrate 1, and end portions of the TFT 2 and the insulating layer 3 formed on the substrate 1, and the sealing layer divided portion A is formed such that a divided surface in a substantial thickness direction of the substrate 1 is formed on an end portion of the sealing layer. In the actual light-emitting device, the sealing layer divided portion A and the substrate divided portion B may have inclination opposite to that of FIG. 2 with respect to the thickness direction of the substrate 1.

A substrate terrace C is on an inner side within the plane of the organic light-emitting device than the substrate divided portion B, that is, a surface of the substrate 1 on the light-emitting region side, or a surface region of the TFT 2 and the insulating layer 3 that are formed on the substrate 1. The substrate terrace C is defined by displacement of each position of the sealing layer divided portion A and the substrate divided portion B.

In the organic light-emitting device of the present invention, it is necessary that the sealing layer divided portion A is positioned closer to the light-emitting region side than the substrate divided portion B, and that the substrate terrace C is formed. When the sealing layer divided portion A is positioned closer to the light-emitting region side than the substrate divided portion B, a division damage of the substrate 1 added to the sealing layer 9 is suppressed, and generation of peeling and crack of the sealing layer 9 can be prevented. Specifically, in a case where the sealing layer divided portion A of the present invention is formed in advance, when the substrate divided portion B is formed (i.e., when the substrate is divided at a predetermined divided position), progress of the peeling and crack which generate in the sealing layer 9 is blocked at the sealing layer divided portion A. As a result, it is possible to prevent the generation of peeling and crack of the sealing layer 9. If the present invention is not applied, there arises a problem of damage of the sealing layer 9, such as generation of crack or pealing of the sealing layer 9 at the divided position.

There is no necessity of setting a width of the substrate terrace C, that is, a distance between the sealing layer divided portion A and the substrate divided portion B, to be constant. If the substrate terrace C does not cause the sealing layer 9 to be damaged in the process of dividing the substrate, the width of the substrate terrace C is not particularly limited. The sealing layer divided portion A and the substrate divided portion B are formed such that the width of the substrate terrace C is desirably set to 1 μm or more.

Each shape of the sealing layer divided portion A, the substrate divided portion B, and the substrate terrace C, as well as a positional relationship therebetween can be confirmed by using a scanning electron microscope (SEM). Each shape of the divided portions and the positional relationship between the divided portions of the present invention can be confirmed by observing them from the upper surface and the oblique direction of the organic light-emitting device and by observing a cross section thereof, at a magnification of 5000 times or more.

The organic light-emitting device according to the present invention can be desirably used for a backlight of a liquid crystal display device as a plane emitter.

The organic light-emitting device according to the present invention can be desirably used for a display portion of a television receiver, a PC monitor, a cellular phone, and the like. Particularly, the organic light-emitting device according to the present invention can be desirably used for a display portion of a mobile device which is assumed to be used in an environment having a wide range of temperature and humidity and which requires high environmental resistance. A display device including the organic light-emitting device of the present invention as a display portion can display a high quality image for a long period of time.

The organic light-emitting device according to the present invention can also be desirably used as an image pickup device such as a digital camera. The image pickup device including the organic light-emitting device of the present invention as a display portion can display a high quality image for a long period of time.

Next, a method of manufacturing the organic light-emitting device according to the present invention will be described.

In the method of manufacturing the organic light-emitting device according to the present invention, it is important to form the sealing layer divided portion A and the substrate divided portion B so as to form the substrate terrace C. For this reason, a division step for the substrate 1 and a division step for the sealing layer 9 are performed separately.

Generally, the division steps includes a scribing step of causing a vertical crack in a division target and a breaking step of breaking the division target at a scribed position. Depending on division techniques and division conditions, the breaking step is not required, and the substrate 1 can be divided only through the scribing step (breakless step). In the present invention, in a case of using a breakless division technique, the breaking step and the scribing step are performed at the same time.

For the scribing step according to the present invention, general scribing techniques such as scribing with a cutter wheel and laser scribing can be used.

FIG. 3 is an enlarged schematic diagram of the divided portion of the substrate on which organic light-emitting elements are formed to be adjacent to each other.

In a step of dividing the large substrate 1 having a plurality of organic light-emitting devices formed thereon into each unit organic light-emitting device, the substrate 1 is scribed at a divided position E, and the sealing layer 9 is scribed at a divided position D on the light-emitting region side.

For the division into each unit organic light-emitting device, any method can be employed as long as the method satisfies the above-mentioned conditions and does not generate pealing and crack due to the division of the sealing layer 9. For example, in the division of the substrate 1 on which the sealing layer 9 is formed, the sealing layer 9 is scribed from the sealing layer side, and the substrate 1 is scribed from the substrate side. Alternatively, the scribing positions of the sealing layer 9 and the substrate 1 are changed such that both are scribed from the sealing layer side.

The scribing of the sealing layer 9 requires settings for detailed conditions because peeling and crack may be generated in the sealing layer 9 when the sealing layer 9 is strongly scribed. It is desirable that scribing be performed on the sealing layer 9 not so as to penetrate the sealing layer, a vertical crack having a size smaller than the layer thickness of the sealing layer 9 be caused in the sealing layer 9, and the sealing layer 9 be broken by a stress difference. The method of applying a stress to the sealing layer is not particularly limited as long as the method is capable of forming the organic light-emitting device of the present invention. As a method of applying a stress to the sealing layer 9, it is possible to utilize application of heat and cooling to a cracked position by the scribing.

With regard to the order of the scribing step for the sealing layer 9 and the subscribing step for the substrate 1, the TFT 2 and the insulating layer 3, it is desirable to perform the scribing step for the substrate 1 after the subscribing step for the sealing layer 9, the TFT 2 and the insulating layer 3 because propagation of peeling and crack can be reliably prevented. However, if the sealing layer 9 is not damaged by the scribing, any order of the scribing steps may be adopted.

Then, the substrate 1 is broken along a line (scribe line) provided at the divided position E, and the sealing layer 9 is broken along a line (scribe line) provided at the divided position D on the light-emitting region side. With regard to the breaking of the substrate 1 and the sealing layer 9, a step of breaking the substrate 1 may be performed after a step of breaking only the sealing layer 9, or the step of breaking the substrate 1 and the step of breaking the sealing layer 9 may be performed at the same time. In the breaking step, a stress applied when the substrate 1 is broken is also transmitted to the sealing layer 9, so even when the scribed positions of the substrate 1 and the sealing layer 9 are different, the substrate 1 and the sealing layer 9 can be broken at the same time. In the case of breaking the substrate 1, the TFT 2 and the insulating layer 3 that are formed on the substrate 1 are also broken at the same time.

By the manufacturing method of the present invention, it is possible to divide the large substrate 1 into each unit organic light-emitting element without generating peeling and crack in the sealing layer 9 due to a large division damage which is caused when the substrate 1 is scribed and broken.

A distance between the divided position E of the substrate 1 and the divided position D of the sealing layer 9 is desirably 10 µm or more at the narrowest distance. This distance is determined in view of displacement of the position at which the scribing is performed or the width of the substrate 1 or the sealing layer 9 to be scraped off during the scribing step.

The divided positions of the substrate 1 and the sealing layer 9 and the relationship between the divided positions can be confirmed by using an optical microscope and a scanning electron microscope (SEM). With regard to the divided positions, in a case where a general scribing technique is applied, scribed traces are left at the divided portions, which can be confirmed by observation from the upper surface or the oblique direction of the organic light-emitting device or by observation of a cross section thereof at a magnification of 500 times or more.

For the division of the substrate 1, and the TFT 2 and the insulating layer 3 that are formed on the substrate 1, general division methods and conditions can be applied as they are. Incidentally, it is necessary to determine the divided position E of the substrate 1 in consideration of a width of the substrate 1 to be scraped off in the horizontal direction or a width thereof in which a damage is caused by the scribing, and accuracy of positioning of a scriber.

EXAMPLE

Hereinafter, the embodiment of the present invention will be described in more detail by taking examples.

Example 1

Figure 4A:
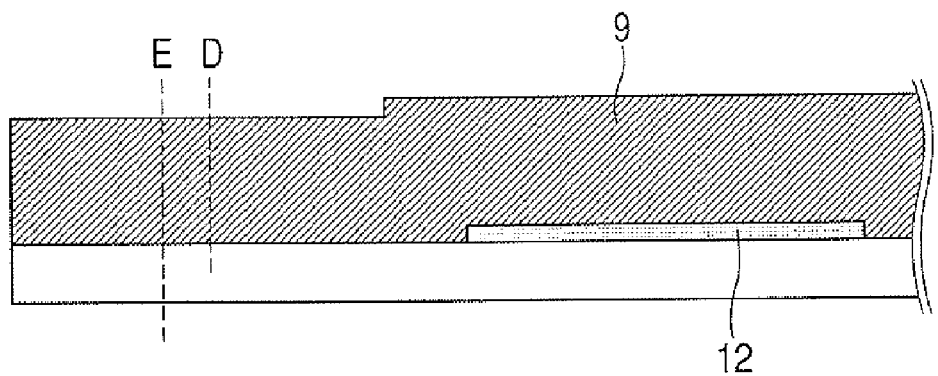
FIGS. 4A and 4B are cross-sectional diagrams for schematically illustrating a structure of an evaluation substrate according to a first example of the present invention.
Figure 4B:
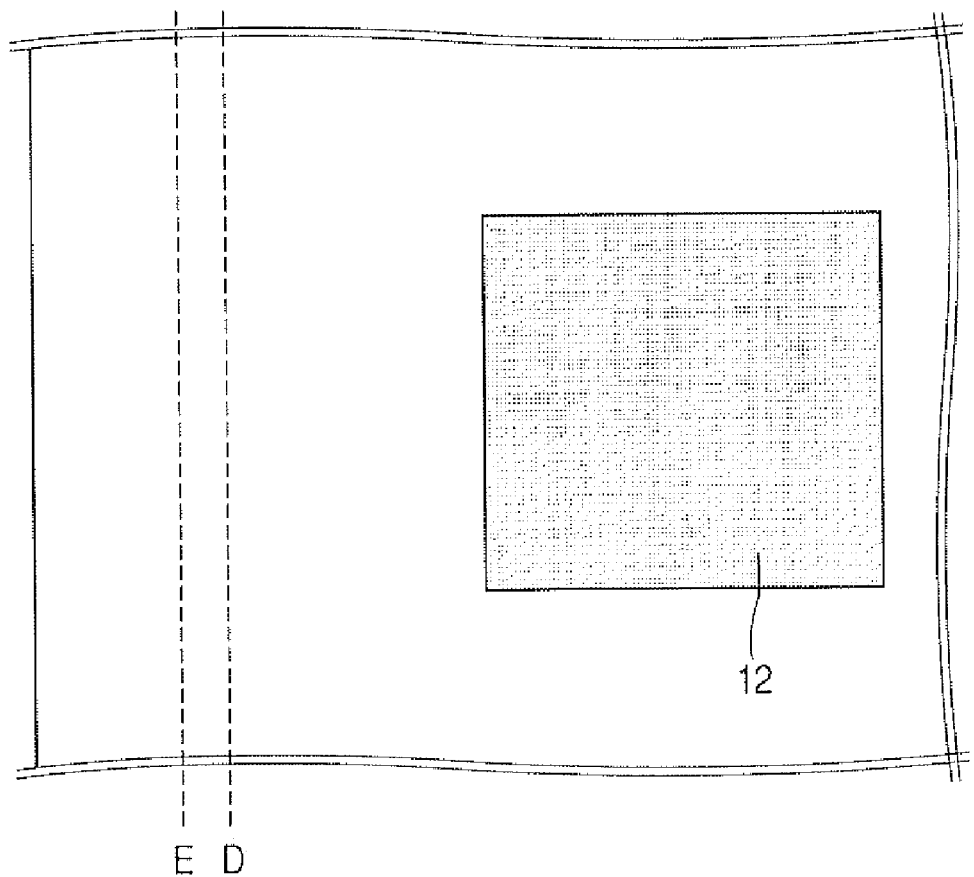

Example 1 of the present invention will be described with reference to FIGS. 4A and 4B. FIGS. 4A and 4B are a cross-sectional diagram and a top view for schematically illustrating a part of an evaluation sample, respectively.

In this example, the evaluation sample was produced as illustrated in FIGS. 4A and 4B, and presence or absence of water entering from a divided position was evaluated based on a change of the permeability caused by Ca corrosion. A Ca film is reacted with water and oxygen, whereby the permeability of the Ca film is changed. Accordingly, in a case where the permeability of the Ca film is changed, it can be determined that water has entered, while in a case where the permeability of the Ca film is not changed, it can be determined that water has not entered.

In the middle of the substrate at which an insulating layer was formed, a Ca film 12 was formed with a thickness of 1000 Å by vacuum vapor-deposition. Subsequently, a silicon nitride layer with a thickness of 5 µm was formed by VHF plasma CVD so as to cover the Ca film 12, thereby forming the sealing layer 9. The whole process from introduction of the substrate to formation of the sealing layer was performed under vacuum.

Then, at the position D of 0.25 mm apart from the end of the Ca film 12, using a cutter wheel blade, the sealing layer 9 was scribed by a layer thickness smaller than that of the sealing layer 9 from the sealing layer side. At this time, by setting the optimum conditions, a divided surface that penetrates the sealing layer 9 at the scribed position is generated because the sealing layer 9 formed of a silicon nitride layer is a hard film. Then, at the position E of 0.3 mm apart from the end of the Ca film 12, using a wheel blade of a high penetration type, the substrate was scribed from the sealing layer 9 side and was subsequently broken, thereby producing the evaluation sample.

When the divided surface of the sample of this example was observed using the SEM, generation of peeling and crack in the sealing layer 9 was confirmed at the divided position E of the substrate. However, generation of peeling and crack was not found on the light-emitting region side from the divided position D of the sealing layer 9.

Even when the evaluation sample of this example was observed after being left in a temperature-controlled and humidity-controlled bath at a temperature of 60° C. and at a relative humidity of 90% RH for 1000 hr, the permeability of the Ca film was not changed.

Comparative Example 1

Figure 5:
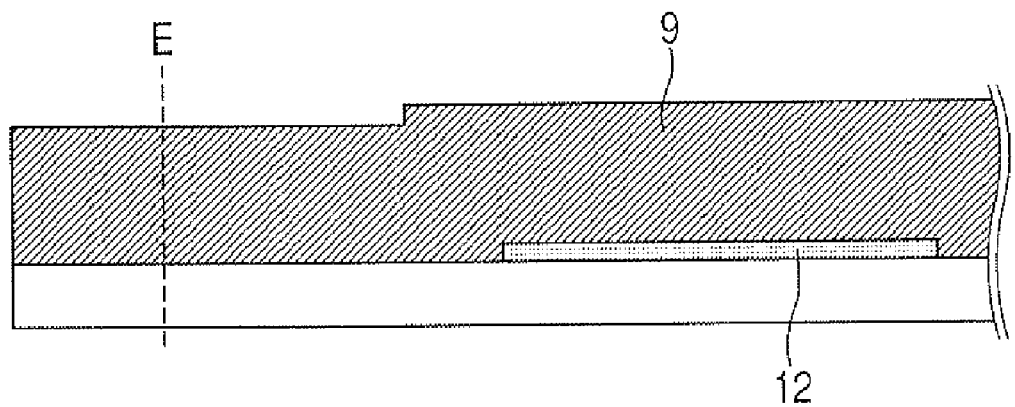
FIG. 5 is a cross-sectional diagram for schematically illustrating a structure of an evaluation substrate according to a first comparative example of the present invention.

This comparative example will be described with reference to FIG. 5. FIG. 5 is a cross-sectional diagram for schematically illustrating a part of an evaluation sample.

In this comparative example, an evaluation sample was produced as illustrated in FIG. 5, and presence or absence of water entering from a divided position was evaluated based on a change of the permeability caused by Ca corrosion.

The evaluation sample of this comparative example was produced in the same steps as those of Example 1. However, the sealing layer 9 and the substrate were divided at the divided position E of the substrate while the sealing layer 9 was not divided at the divided position D of the sealing layer. The sealing layer 9 and the substrate were divided at a position of 0.3 mm apart from the end of the Ca film 12 from the sealing layer 9 side.

When the divided positions of the sample of this comparative example were observed using the SEM, peeling and crack were generated in the sealing layer 9. The damage to the sealing layer 9 caused by the division was present within 0.5 mm or less from the divided position.

After the evaluation sample of this comparative example was left in a temperature-controlled and humidity-controlled bath at a temperature of 60° C. and at a relative humidity of 90% RH for 1000 hr, corrosion of the Ca film from a direction of the divided position, and reduction in permeability over a region within about 25 mm from the divided position were observed.

Comparative Example 2

Also in this comparative example, an evaluation sample as illustrated in FIG. 5 was produced, and presence or absence of water entering from a divided portion was evaluated based on a change of the permeability caused by Ca corrosion.

The evaluation sample of this comparative example was produced by the same steps as those of Example 1. However, the sealing layer 9 and the substrate were divided at the divided position E of the substrate while the sealing layer 9 was not divided at the divided position D of the sealing layer. The sealing layer 9 and the substrate were divided at a position of 0.3 mm apart from the end of the Ca film 12 from the substrate side.

When the divided positions of the sample according to this comparative example were observed using the SEM, peeling was generated in the sealing layer 9. The damage to the sealing layer 9 caused by the division was present within 0.3 mm or less from the divided position.

After the evaluation sample of this comparative example was left in a temperature-controlled and humidity-controlled bath at a temperature of 60° C. and at a relative humidity of 90% RH for 1000 hr, corrosion of the Ca film from a direction of the divided position, and reduction in permeability over a region within about 15 mm from the divided position were observed.

Example 2

Figure 6:
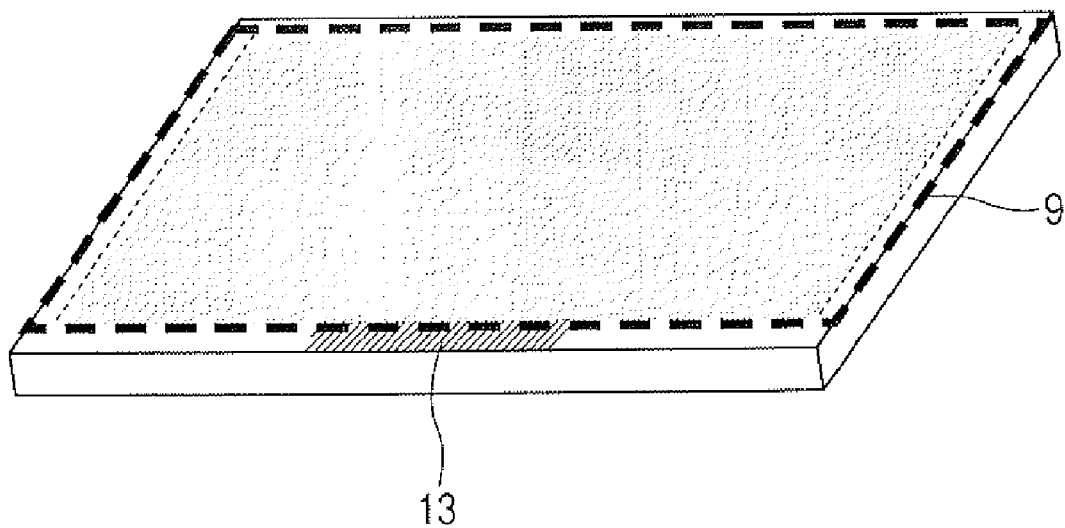
FIG. 6 is a perspective view for illustrating an example according to the embodiment of the organic light-emitting device of the present invention.

Example 2 of the present invention will be described with reference to FIGS. 1, 3 and 6.

In this example, the organic light-emitting device illustrated in FIG. 1 was produced to perform light emission characteristic evaluation for the organic light-emitting device.

In this example, on the large substrate 1, a plurality of unit organic light-emitting devices with the structure as illustrated in FIG. 1 were formed so as to be adjacent to each other, and were cut into each unit organic light-emitting device after formation of the sealing layer 9. As illustrated in FIG. 6, on one side of the organic light-emitting device on which a power supply member or a signal supplying pad (signal supplying member) 13 was formed, and on the opposite side thereof, there was provided a region (underlying-layer-exposed region) in which the sealing layer 9 was not formed. This is because, when the sealing layer 9 is formed on the side on which the power supply member or the signal supplying pad 13 is formed, the power supply member or the signal supplying pad cannot be made electrically conductive with an external connection wiring such as an FPC. As a result, a step of peeling the sealing layer is required, which makes the manufacturing process more complicated. In a case where the opposite side corresponds to a side of the adjacent organic light-emitting devices on which the power supply member or the signal supplying pad 13 is formed, the region (underlying-layer-exposed region) in which the sealing layer is not formed can be processed at the same time during the formation of the sealing layer of the adjacent organic light-emitting devices. On two sides of the adjacent organic light-emitting devices other than the above-mentioned sides, the continuous sealing layer 9 was formed on the adjacent unit organic light-emitting devices, and the sealing layer 9 and the substrate 1 were divided to be cut into each unit organic light-emitting device.

Specifically, the organic light-emitting device according to this example was produced in the following manner. That is, the TFT 2, the insulating layer 3, and the organic planarizing layer 4 were successively formed so as to form a plurality of organic light-emitting devices on the large substrate 1. Then, a contact hole between the first electrode 5 and the TFT 2 was formed thereon. Subsequently, the first electrode 5 was formed, and the element isolation film 8 made of polyimide was formed in the periphery of the first electrode 5 for insulation. On the substrate 1, the organic compound layer 6 of $FL03/DpyFL+sDTAB2/DFPH1/DFPH1+Cs_2Co_3$ was deposited, and the organic compound layer 6 was formed in the order of a hole transport layer, a light-emitting layer, an electron transport layer, and an electron injection layer. On top of the layer, the second electrode 7 made of an ITO was formed as a layer having a thickness of 60 nm by sputtering to thereby form a pixel. Further, a silicon nitride layer with a thickness of 5 μm was formed by VHF plasma CVD so as to cover the organic planarizing layer 4, the first electrode 5, the organic compound layer 6, the second electrode 7, the element isolation film 8, and an adhesive layer 10, thereby forming the sealing layer 9. As a result, an organic light-emitting device panel having a plurality of organic light-emitting devices formed on the large substrate 1 was produced. The whole process from introduction of the substrate 1 to formation of the sealing layer 9 was performed under in vacuum.

Then, in the same manner as in the first example, the organic light-emitting device panel was divided at the divided positions D of the sealing layer of FIG. 3. In other words, the sealing layer 9 was scribed from the sealing layer side using a cutter wheel blade. Subsequently, at the divided position E of the substrate, using a wheel blade of a high penetration type, the substrate 1, the TFT 2, and the insulating layer 3 were scribed from the sealing layer side and were then broken, to thereby obtain each unit organic light-emitting device. The divided position D of the sealing layer corresponds to a position 50 μm apart from the divided position E of the substrate on the light-emitting region side.

When the divided positions of the organic light-emitting device of the present invention were observed using an optical microscope and the SEM, no crack or peeling was found in the sealing layer 9 which is closer to the light-emitting region than the divided position D of the sealing layer.

Finally, the circularly polarizing plate 11 was fixed to the organic light-emitting device through the adhesive material 10.

After the organic light-emitting device of this example was left in a temperature-controlled and humidity-controlled bath at a temperature of 60° C. and at a relative humidity of 90% RH for 1000 hr to be evaluated, deterioration of the VI characteristic and luminance was not found. In addition, luminance change and a dark spot having a diameter Φ of 1 μm or more from an outer circumferential region of the organic light-emitting device were not caused, and luminance deterioration and a dark spot having a diameter Φ of 1 μm or more from the periphery of pixels were not caused.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-185784, filed Jul. 5, 2006, and 2007-146707, filed Jun. 1, 2007, which are hereby incorporated by reference herein in their entirety.

What is claimed is:

1. A method of manufacturing an organic light-emitting device including: a substrate; an organic light-emitting element including a first electrode, an organic light-emitting layer, and a second electrode in the stated order on the substrate; and an inorganic sealing layer covering the organic light-emitting element, comprising the steps of:

forming the organic light emitting element including the first electrode, the organic light-emitting layer, and the second electrode in mentioned order on the substrate;

forming the inorganic sealing layer on the second electrode;

dividing the inorganic sealing layer in the vicinity of the organic light-emitting element; and dividing the substrate in the vicinity of the organic light-emitting element, by scribing the substrate, and breaking the substrate along lines formed by scribing the substrate, wherein the dividing of the inorganic sealing layer is performed at a position on an inner side of a plane of the organic light-emitting device than a position at which the substrate is divided and includes scribing the inorganic sealing layer, and breaking the inorganic sealing layer along lines formed by the scribing of the inorganic sealing layer, and wherein the step of scribing the substrate is performed after the step of scribing the inorganic sealing layer.

* * * * *